(12) United States Patent
Hsieh

(10) Patent No.: US 7,157,343 B2
(45) Date of Patent: Jan. 2, 2007

(54) METHOD FOR FABRICATING SEMICONDUCTOR DEVICE

(75) Inventor: Ping-Pang Hsieh, Shanhua Township, Tainan County (TW)

(73) Assignee: United Microelectronics Corp., Hsinchu (TW)

( * ) Notice: Subject to any disclaimer, the term of this patent is extended or adjusted under 35 U.S.C. 154(b) by 62 days.

(21) Appl. No.: 11/078,543

(22) Filed: Mar. 11, 2005

(65) Prior Publication Data

US 2005/0227447 A1    Oct. 13, 2005

Related U.S. Application Data

(62) Division of application No. 10/820,601, filed on Apr. 7, 2004.

(51) Int. Cl.
*H01L 21/336* (2006.01)
*H01L 21/425* (2006.01)

(52) U.S. Cl. .................. 438/305; 438/303; 438/517

(58) Field of Classification Search ................ 438/305, 438/517, 279, 303, 592, 625, 630; 257/E21.191, 257/E21.192, E21.337, E21.438, E21.409, 257/E21.422
See application file for complete search history.

(56) References Cited

U.S. PATENT DOCUMENTS

| | | | | |
|---|---|---|---|---|
| 4,471,524 A | * | 9/1984 | Kinsbron et al. | 438/128 |
| 5,612,249 A | * | 3/1997 | Sun et al. | 438/297 |
| 6,380,053 B1 | * | 4/2002 | Komatsu | 438/517 |
| 6,448,140 B1 | * | 9/2002 | Liaw | 438/279 |
| 2001/0016362 A1 | * | 8/2001 | Brooks et al. | 438/4 |
| 2004/0137672 A1 | * | 7/2004 | Lee et al. | 438/183 |
| 2004/0180504 A1 | * | 9/2004 | Lee et al. | 438/303 |
| 2005/0227447 A1 | * | 10/2005 | Hsieh | 438/305 |

* cited by examiner

*Primary Examiner*—Walter Lindsay, Jr.
(74) *Attorney, Agent, or Firm*—J.C. Patents

(57) ABSTRACT

A method for fabricating a semiconductor device is provided. The method comprises: providing a substrate; forming a gate structure on the substrate, the gate structure including a gate dielectric layer on the substrate and a gate conductive layer on the gate dielectric layer; forming an oxide layer conformally covering the substrate and the gate structure; forming a dielectric layer covering the oxide layer; removing a portion of the dielectric layer to form a spacer on a sidewall of the gate structure, the oxide layer between the spacer and the gate structure as an oxide spacer; performing an oxygen plasma treatment process to form an silicon oxide layer in the substrate below the oxide layer, the silicon oxide layer and the oxide layer being an offset oxide layer; and forming a source/drain region in the substrate at two sides of the gate structure.

8 Claims, 3 Drawing Sheets

METHOD FOR FABRICATING SEMICONDUCTOR DEVICE

CROSS-REFERENCE TO RELATED APPLICATION

This application is division of, and claims the priority benefit of, U.S. application Ser. No. 10/820,601 filed on Apr. 07, 2004.

BACKGROUND OF THE INVENTION

1. Field of the Invention

This invention generally relates to a method for fabricating a semiconductor device, and more particularly to a method for fabricating a semiconductor device to enhance the uniformity of the semiconductor device.

2. Description of Related Art

As the line width and the size of the semiconductor device become smaller, it is unavoidable that the polysilicon electrode of the MOSFET and the memory device become smaller. When the integration of the devices increases, the resistance of the source region and the drain region usually increases. However, as the size of the device shrinks and its process margin declines, the uniformity of the semiconductor devices becomes worse.

During the fabrication of the MOSFET, after the gate electrode is formed by forming a gate oxide layer and a polysilicon layer, the spacer made of silicon oxide or silicon nitride will be formed on the two sidewalls of the gate electrode. Later on, the ion implantation is performed to form the source and drain regions at the two sides of the gate electrode and then the salicide process is performed. However, if the silicon oxide spacer is employed, a cleaning step has to be performed to remove the native oxide layer and impurity on the surface of the gate electrode and the substrate before performing the salicide process. A portion of the silicon oxide spacer may be removed during the cleaning step. Hence, the subsequently formed silicide would be very close to the source/drain extension, which is easy to cause the junction leakage problems. On the other hand, if the silicon nitride spacer is employed to avoid the junction leakage problems, because the dielectric constant of silicon nitride is higher than that of silicon oxide, the silicon nitride spacer results in a larger parasitic capacitance between the gate and the source/drain region, thus deteriorating the device performance.

A composite silicon oxide/silicon nitride spacer may also be formed on the sidewalls of the gate after defining the gate electrode. The composite spacer can be formed by forming an offset oxide layer covering the substrate and the gate electrode, forming a silicon nitride layer covering the offset oxide layer and then performing anisotropic etching to remove a portion of silicon nitride layer until the offset oxide layer is exposed. The remaining offset oxide layer can protect the surface of the substrate when performing the ion implantation step to the substrate. However, when the size of the device and the line-width shrink, the thickness of each layer and the process margin in each layer also become smaller. Especially, when the thickness of the offset oxide layer is less than or about 100 Å, the thin offset oxide layer can easily be overetched and the thickness of the remaining offset oxide layer is not uniform in various locations. Since the thickness of the remaining offset oxide layer is varied, the junction depth of the source/drain region becomes non-uniform after the ion implantation step through the non-uniform offset oxide layer. In addition to the non-uniform depth of the source/drain region, the effective channel length of the gate electrode may be changed, which significantly affects the uniformity of the semiconductor devices on the wafer.

SUMMARY OF THE INVENTION

An object of the present invention is to provide a method for fabricating semiconductor device in order to prevent junction leakage, reduce the parasitic capacitance between the gate and source/drain regions, and enhance the uniformity of the semiconductor devices.

The present invention provides a method for fabricating a semiconductor device, comprising: providing a substrate; forming a gate structure on the substrate, the gate structure including a gate dielectric layer on the substrate and a gate conductive layer on the gate dielectric layer; forming an oxide layer conformally covering the substrate and the gate structure; forming a dielectric layer covering the oxide layer; removing a portion of the dielectric layer to expose the oxide layer and to form a spacer on a sidewall of the gate structure, the oxide layer between the spacer and the gate structure as an oxide spacer; performing an oxygen plasma treatment process to form an silicon oxide layer in the substrate below the exposed oxide layer using the gate structure and the spacer as masks, the silicon oxide layer and the oxide layer constituting an uniform offset oxide layer; and forming a source/drain region in the substrate at two sides of the gate structure. The method of this invention can further comprises performing a cleaning process to clean the surface of the substrate and forming a silicide layer on the source/drain region.

The present invention provides a semiconductor device, at least comprising: a substrate; a gate structure on the substrate, the gate structure including a gate dielectric layer on the substrate and a gate conductive layer on the gate dielectric layer; an oxide spacer on a sidewall of the gate structure; a spacer on the oxide spacer; a source/drain region in the substrate besides the gate structure and the spacer; and an offset oxide layer covering the substrate and the source/drain region, the offset oxide layer having a bottom surface below a bottom surface of the gate dielectric layer.

Because in the present invention an oxygen plasma treatment process is performed before performing the source/drain ion implantation step in order to form an uniform offset oxide layer on the substrate, the depth of the subsequently formed source/drain regions will be uniform, which provides a constant effective channel width.

The above is a brief description of some deficiencies in the prior art and advantages of the present invention. Other features, advantages and embodiments of the invention will be apparent to those skilled in the art from the following description, accompanying drawings and appended claims.

DESCRIPTION OF THE PREFERRED EMBODIMENTS

FIGS. 1A–1F show the cross-sectional view of the process for fabricating a semiconductor device in accordance with a preferred embodiment of the present invention.

Figure 1A:
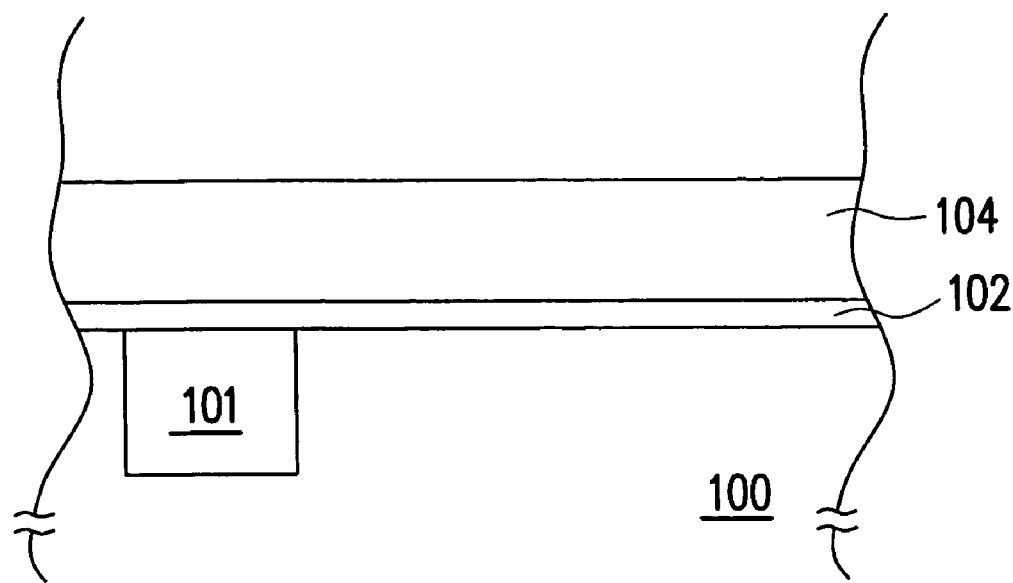
FIGS. 1A–1F show the cross-sectional view of the process for fabricating a semiconductor device in accordance with a preferred embodiment of the present invention.

Referring to FIG. 1A, a substrate 100 such as a silicon substrate is provided. The substrate 100 includes an isolation structure 101 such as LOCOS or STI, and other semiconductor devices. A gate dielectric layer 102 is formed on the substrate 100. A gate conductive layer 104 is formed on the gate dielectric layer 102. The gate dielectric layer 102 is, for example, an oxide layer. The gate conductive layer 104 can be doped polysilicon formed by in-situ doping by CVD, for example.

Figure 1B:
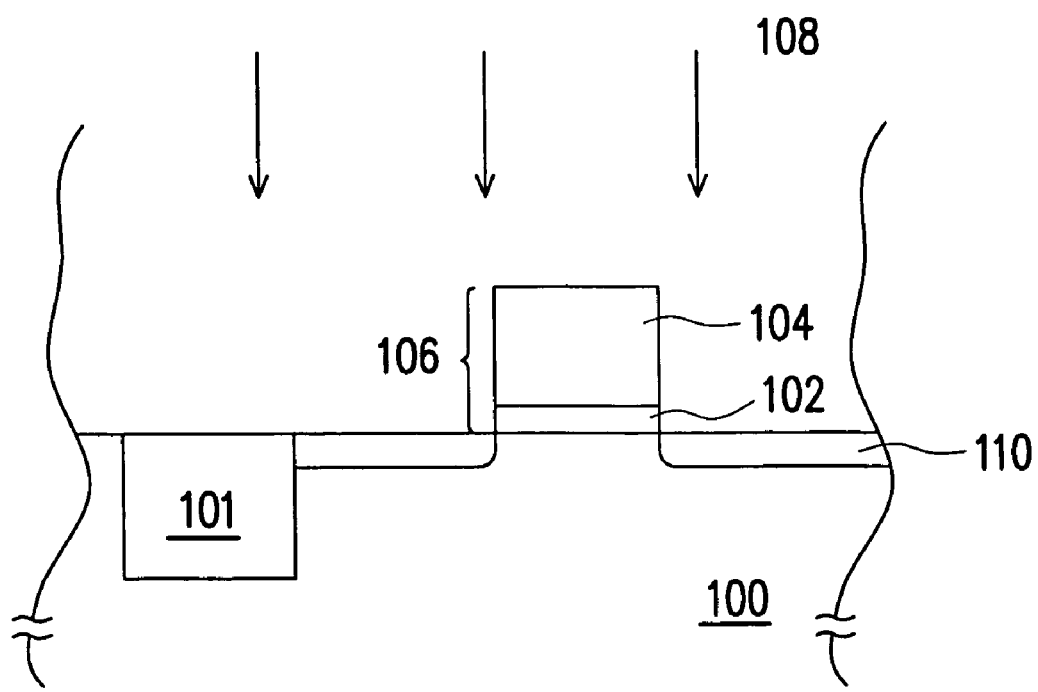

Referring to FIG. 1B, a gate structure 106 is formed by defining the gate dielectric layer 102 and the gate conductive layer 104 using photolithographic and etching technology.

Then an ion implantation process 108 is performed by using the gate structure 106 as a mask to form the lightly doped source/drain extension region 110 in the substrate 100 at the two sides of the gate structure 106.

Figure 1C:
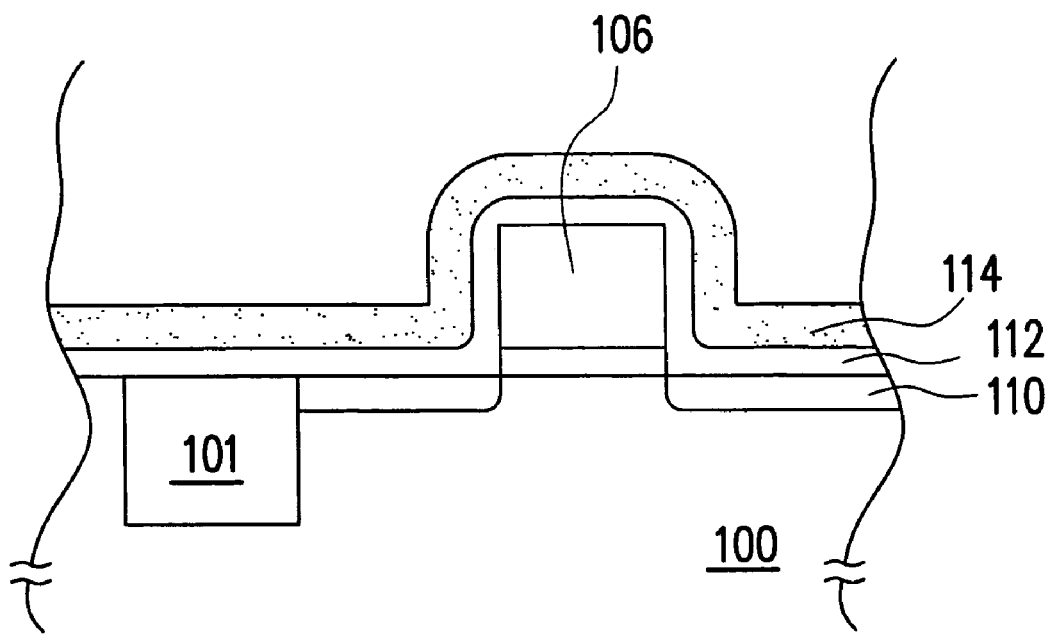

Referring to FIG. 1C, a conformal oxide layer is formed on the substrate 100 to cover the gate structure 106 and the substrate 100. The oxide layer 112 can be silicon oxide formed by CVD and using tetra ethyl ortho silicate (TEOS)/ozone, for example. The thickness of the oxide layer 112 is about 50–300 Å, for example. Then a conformal dielectric layer 114 is formed on the oxide layer 112 to cover the substrate 100 and the gate structure 106. The dielectric layer 114 has a high etching selectivity related to the oxide layer, and the dielectric layer 114 will not be affected when removing the native oxide layer. The dielectric layer 114, for example, is made of silicon nitride by CVD. The thickness of the dielectric layer is usually larger than that of the oxide layer.

Figure 1D:
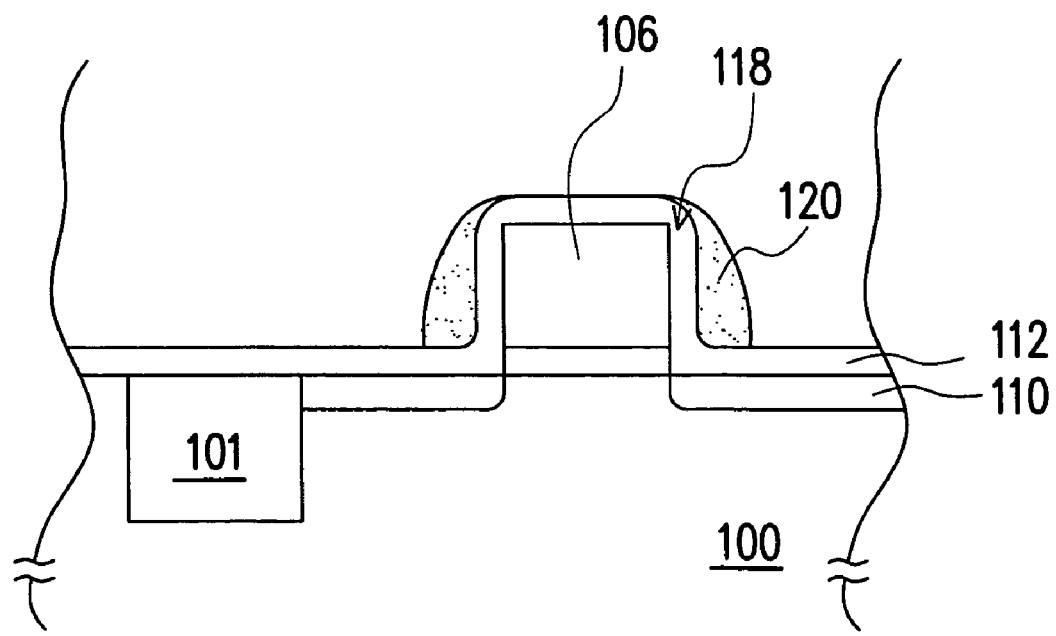

Referring to FIG. 1D, a portion of the dielectric layer 114 is removed until the oxide layer 112 is exposed. Only the dielectric layer 114 on the sidewall of the gate structure is remaining as the spacer 120. The oxide layer between the spacer 120 and the gate structure 106 can be deemed as an offset oxide spacer 118. The thickness of the offset oxide spacer 118, e.g., 50–200 Å, is smaller than that of the spacer 120. The portion of the dielectric layer 114 can be removed by anisotropic etching such as reactive ion etching (RIE). Taking advantage of the high etching selectivity of the oxide layer to the dielectric layer, the dielectric layer 114 is removed until the oxide layer 112 is exposed. After removing the dielectric layer 114 and forming the spacer 120, the oxide layer 112 is exposed except the oxide layer below the spacer 120 is covered the spacer 120.

Figure 1E:
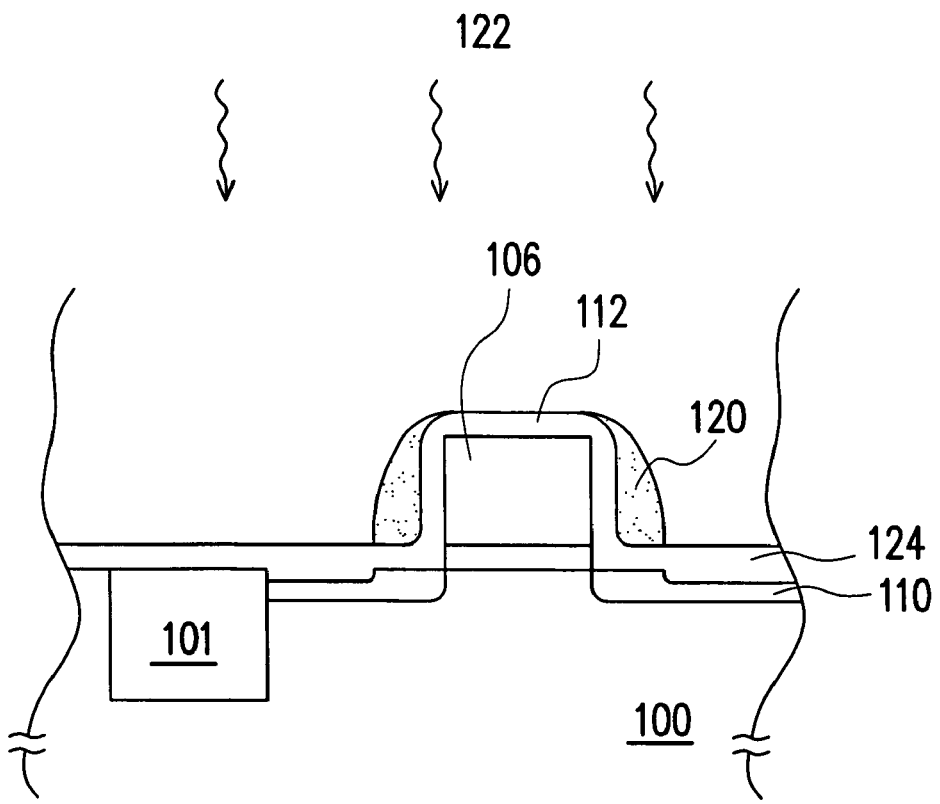

Because the remaining oxide layer 112 on the substrate can protect the surface of the substrate from damage due to the subsequent ion implantation, if the remaining oxide layer is non-uniform at the source/drain region, the depth of the source/drain region becomes non-uniform after the ion implantation. Referring to FIG. 1E, to improve the uniformity of the oxide layer, especially the oxide layer covering the subsequently formed source/drain region, an oxygen plasma treatment process is performed by using the spacer 120 and the gate structure 106 as masks. A gas source including oxygen is flowed into the chamber to generate the plasma and the DC power of 100-2000 W is applied, for example. With the plasma treatment process, oxygen atoms are implanted to the surface of the substrate, especially the substrate predetermined for forming source/drain region, and reacted with the substrate to form silicon oxide. That is, a thin oxide layer will be formed below the oxide layer 112 so that an offset oxide layer 124 with a uniform thickness is formed. The applied DC power, the implantation dosage and the treatment time can be adjusted based on the required thickness of the offset oxide layer.

Because the oxygen plasma treatment process is performed by using the spacer 120 and the gate structure 106 as masks, the implanted oxygen atoms only react with the exposed oxide layer. The implanted oxygen atoms will only react with the silicon atoms of the substrate (consuming the silicon atoms of the substrate) to form the silicon oxide. Further, the thickness of the remaining oxide layer covering the substrate will affect the depth and the density of the implanted oxygen atoms, because the plasma treatment process is performed through the oxide layer covering the substrate. That is, the thicker the remaining oxide layer is, the lesser silicon oxide is later formed, and vices versa. Hence, the later formed silicon oxide can counterbalance (offset) the non-uniformity of the remaining oxide layer and forms a uniform offset oxide layer 124. The offset oxide layer 124 includes the remaining oxide layer 112 and the silicon oxide formed by the oxygen plasma treatment process.

The implanted oxygen atoms will also be implanted into the gate conductive layer of the gate structure through the oxide layer 112 covering the top surface of the gate structure 106. If the material of the gate conductive layer is polysilicon, the implanted oxygen atoms will react with the polysilicon to form silicon oxide so that the oxide layer 112 on the gate structure 106 will become thicker. However, because the depth of the implanted oxygen atoms is not too deep, it will not consume too much silicon in the polysilicon layer and the performance of the gate structure will not be seriously affected.

Figure 1F:
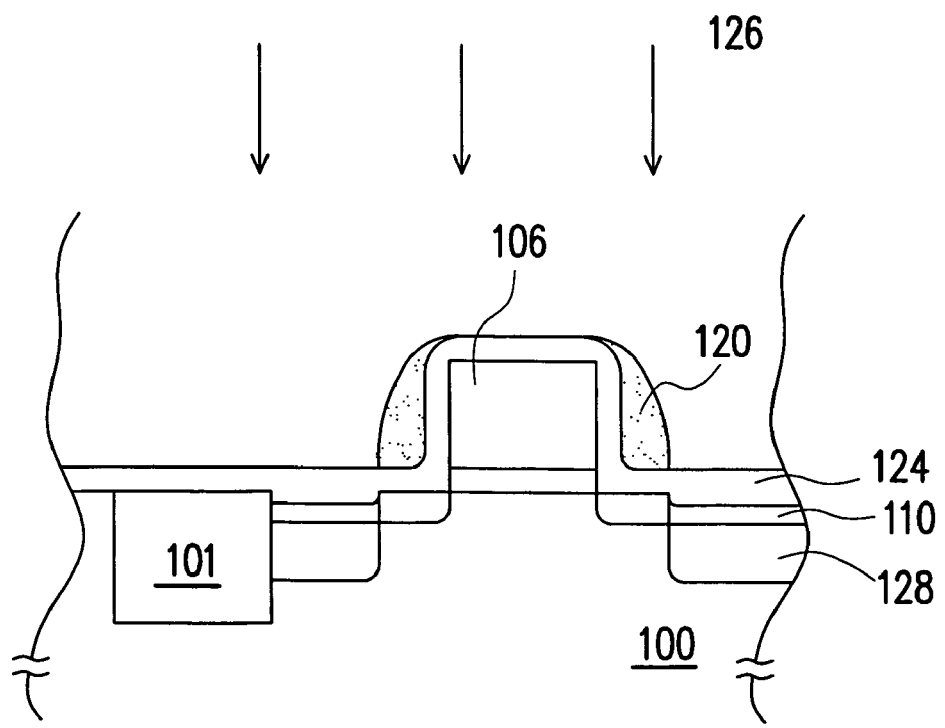

Referring to FIG. 1F, an ion implantation process 126 is performed by using the spacer 120 and the gate structure 106 as masks to form the heavily doped source/drain region 128 in the substrate 100 at the two sides of the spacer 120 and the gate structure 106. Because there is a uniform offset oxide layer 124 on the substrate, the depth of the source/drain region 128 is uniform and the effective channel length is unvaried.

Later, if necessary, a self-align silicide process can be performed depending on the types of the devices. Because the self-align silicide process is well known by the one skilled in the art, no detailed description is necessary. Before self-align silicide process, an additional cleaning process is required to remove the oxide layer and the impurity between the gate and the surface of the substrate. The aforementioned offset oxide layer will also be removed.

In the above embodiment, the oxide layer can be silicon oxide or a dielectric material with a dielectric constant less than 4 to reduce the parasitic capacitance and enhance the performance of the device. The material of the dielectric layer can be silicon nitride, SiON, or other material having a high selectivity related to the oxide layer.

The semiconductor device based on the above embodiment as shown in FIG. 1F comprises: a substrate 100; a gate structure 106 on the substrate 100, the gate structure 106 including a gate dielectric layer 102 on the substrate 100 and a gate conductive layer 104 on the gate dielectric layer 102; an oxide spacer 118 on a sidewall of the gate structure 106; a silicon nitride spacer 120 on the oxide spacer 118; a source/drain region 128 in the substrate 100 besides the spacer 120 and the gate structure 106; and an offset oxide layer 124 covering the substrate 100 and the source/drain region 128, the offset oxide layer 124 having a bottom surface below a bottom surface of the gate dielectric layer 102. It further comprises a source/drain extension region below the oxide spacer 118.

Because a uniform offset oxide layer 124 is formed on the substrate by performing the oxygen plasma treatment process, the depth of the source/drain region 128 is uniform so that the effective channel length will not be affected and the uniformity and performance of the device will be enhanced.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A method for fabricating a semiconductor device, comprising:
    providing a substrate;
    forming a gate structure on said substrate, said gate structure including a gate dielectric layer on said substrate and a gate conductive layer on said gate dielectric layer;
    forming an oxide layer conformally covering said substrate and said gate structure;
    forming a dielectric layer covering said oxide layer;
    removing a portion of said dielectric layer to form a spacer on a sidewall of said gate structure until said oxide layer is exposed, said oxide layer disposed between said spacer and said gate structure being deemed as an oxide spacer;
    performing an oxygen plasma treatment process to form an silicon oxide layer in said substrate below said oxide layer, said silicon oxide layer and said oxide layer constituting an offset oxide layer; and
    forming a source/drain region in said substrate at two sides of said gate structure.

2. The method of claim 1, wherein a material of said oxide layer includes silicon oxide.

3. The method of claim 1, wherein a material of said dielectric layer includes silicon nitride.

4. The method of claim 1, wherein a width of said oxide spacer is not larger than a width of said spacer.

5. The method of claim 1, wherein said step of removing a portion of said dielectric layer includes performing an anisotropic etching process.

6. The method of claim 5, wherein said anisotropic etching process is a reactive ion etching process.

7. The method of claim 1, wherein said oxide layer has an etching selectivity relative to said dielectric layer for said step of removing a portion of said dielectric layer.

8. The method of claim 1, before said step of forming said oxide layer, further comprising forming a source/drain extension region in said substrate at two sides of said gate structure.

* * * * *